(12) United States Patent
Piquette et al.

(10) Patent No.: US 11,515,454 B2
(45) Date of Patent: Nov. 29, 2022

(54) METHODS FOR PRODUCING A CONVERSION ELEMENT AND AN OPTOELECTRONIC COMPONENT

(71) Applicant: OSRAM Opto Semiconductors GmbH, Regensburg (DE)

(72) Inventors: Alan Piquette, Peabody, MA (US); Adam Scotch, Amesbury, MA (US); Maxim N. Tchoul, Winchester, MA (US); Gertrud Kraeuter, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 276 days.

(21) Appl. No.: 16/909,685

(22) Filed: Jun. 23, 2020

(65) Prior Publication Data
US 2020/0321496 A1     Oct. 8, 2020

Related U.S. Application Data

(62) Division of application No. 15/932,366, filed on Feb. 16, 2018, now Pat. No. 10,727,379.

(51) Int. Cl.
*H01L 33/56* (2010.01)
*H01L 33/50* (2010.01)

(52) U.S. Cl.
CPC .......... *H01L 33/504* (2013.01); *H01L 33/501* (2013.01); *H01L 33/56* (2013.01);
(Continued)

(58) Field of Classification Search
USPC ........................................................ 428/690
See application file for complete search history.

(56) References Cited

U.S. PATENT DOCUMENTS 5,800,926 A * 9/1998 Nogami ................. C08G 77/24
528/42
5,989,378 A * 11/1999 Liu ...................... B41M 5/5218
428/452

(Continued)

FOREIGN PATENT DOCUMENTS

EP      2535955 A2    12/2012
EP      3020750 A1     5/2016
(Continued)

*Primary Examiner* — Peter A Salamon
(74) *Attorney, Agent, or Firm* — ArentFox Schiff LLP

(57) ABSTRACT

The invention relates to a method for producing a conversion element for an optoelectronic component comprising the steps of: A) Producing a first layer, for that purpose: A1) Providing a polysiloxane precursor material, which is liquid, A2) Mixing a phosphor to the polysiloxane precursor material, wherein the phosphor is suitable for conversion of radiation, A3) Curing the arrangement produced under step A2) to produce a first layer having a phosphor mixed in a cured polysiloxane material, which comprises a three-dimensional crosslinking network based primarily on T-units, where the ratio of T-units to all units is greater than 80%, B) Producing a phosphor-free second layer, for that purpose: B1) Providing the polysiloxane precursor material, which is liquid, B2) Mixing a filler to the polysiloxane precursor material, wherein the filler is in a cured and powdered form, wherein the filler has a refractive index, which is equal to the refractive index of the cured polysiloxane material, B3) Curing the arrangement produced under step B2) to produce a second layer having a filler mixed in the cured polysiloxane material, which comprises a three-dimensional crosslinking network based primarily on T-units, wherein the produced conversion element is formed as a plate having a thickness of at least 100 μm.

15 Claims, 8 Drawing Sheets

(52) U.S. Cl.
CPC .... *H01L 33/505* (2013.01); *H01L 2933/0041* (2013.01); *H01L 2933/0091* (2013.01)

(56) References Cited

U.S. PATENT DOCUMENTS

| | | | |
|---|---|---|---|
| 2011/0298004 A1* | 12/2011 | Matsuda | H01L 33/50 257/E33.059 |
| 2012/0319153 A1* | 12/2012 | Matsuda | H01L 33/507 428/339 |
| 2015/0099465 A1 | 4/2015 | Suzuki | |
| 2015/0123156 A1* | 5/2015 | Eberhardt | H01L 33/483 257/98 |
| 2015/0299465 A1* | 10/2015 | Toyota | C08G 65/22 528/14 |
| 2019/0172982 A1 | 6/2019 | Piquette et al. | |
| 2019/0259919 A1 | 8/2019 | Piquette et al. | |

FOREIGN PATENT DOCUMENTS

| | | |
|---|---|---|
| WO | 2017182390 A1 | 10/2017 |
| WO | 2018002334 A1 | 1/2018 |

\* cited by examiner d=96 μm d=112 μm d=178 μm

METHODS FOR PRODUCING A CONVERSION ELEMENT AND AN OPTOELECTRONIC COMPONENT

This application is a divisional of U.S. patent application Ser. No. 15/932,366, titled "METHODS FOR PRODUCING A CONVERSION ELEMENT AND AN OPTOELECTRONIC COMPONENT," filed on Feb. 16, 2018, the disclosure of the application is hereby incorporated by reference in its entirety.

BACKGROUND OF THE INVENTION

The invention relates to methods for producing a conversion element for an optoelectronic component. The invention further relates to an optoelectronic component, in particular a light-emitting diode.

There is a need in the industry for optoelectronic components for a down-conversion material that, when combined with the blue light-emitting chip, generates a warm white spectrum with good color rendering. This generally implies that at least two phosphor compositions are required, for example a green garnet-type phosphor and a red nitride-type phosphor. Additionally, this down-conversion material must simultaneously tolerate both high blue light fluxes and high temperatures over long periods of time. The standard ways of making down-conversion materials all have drawbacks when a warm white, high CR1 solution is needed. For example, the familiar phosphor and silicone down-converters, which are found in many products today, are not sufficient because the silicone materials degrade rapidly at high light flux and temperatures. Single crystal and ceramic down-conversion materials can tolerate high light flux and temperatures because they have relatively high thermal stability and thermal conductivities, but they are generally limited to one phosphor composition, which means that they cannot produce the required warm white spectrum. The phosphor-in-glass and phosphor-on-glass down-conversion approaches are suitable for accommodating multiple phosphor compositions but only if the processing temperature is kept below about 350° C. or the red nitride phosphors start to degrade. The phosphor-in-glass and phosphor-on-glass down-converters have better thermal stability than the phosphor and silicone down-converters but their thermal conductivities are inferior to the ceramic or single crystal alternatives. The downside of the phosphor-in-glass or phosphor-on-glass approach is that the most stable glasses require processing temperatures above 350° C. There is still a need for a material that can accommodate more than one phosphor composition, is stable at high temperatures and high light flux and can be processed safely at under 350° C.

On surface-emitting, or thin-film type, optoelectronic components, like LEDs, the top surface of the LED chips is where the major share of light is emitted. For such LEDs it is common to place the down-converting element as close to the top surface as possible. One of the main reasons for this is thermal management. Stokes heat generated in the down-conversion process can be effectively removed through the LED device. Most thin-film type LEDs require at least one wire bond near the top surface in order to supply electricity. These wire bonds protrude above the top of the chip. The distance above the chip surface depends on the design of a given product but is typically in the order of about 125 µm. These wire bonds are fragile and cannot be exposed so that they are typically encapsulated in a protective material. For high-luminescence applications it is an often used practice to glue a down-converter directly on the chip surface. Then, to reduce emission from the sides of the down-converter, the sides of the converters are covered by a highly reflective material. The most common reflective material is titanium dioxide powder dispersed in a silicone. Not only does the titania-in-silicone prevent side emission, it also provides protection for the bond wires. This places a limitation on the thickness of the down-converter. It should be at least as tall as the distance by which the bond wire protrudes above the chip so that the side casting process completely covers the wire bond but does not block the forward light path.

Therefore, for uses in an LED package, the down-converter needs to be about 125 µm thick or even thicker. This thickness limitation is not ideal from a thermal management point of view. It is better if a conversion element is located in a more concentrated area near the chip. In this way, the Stokes heat can be removed from the phosphor through the LED chip. Therefore, there is a need for a conversion element that has the conversion material concentrated in a small volume with a thickness of less than 150 µm. The remainder of the 150 µm thickness can come as an additional layer or additional layers that do not contain down-conversion material.

SUMMARY

The aim of the invention is to provide methods for producing a conversion element for an optoelectronic component. Each of the methods produces a conversion element that overcomes the above-mentioned disadvantages. A further aim of the invention is to provide an optoelectronic component comprising a conversion element which is producible by the above-mentioned methods and overcomes the above-mentioned disadvantages.

These objects are achieved by methods for producing a conversion element for an optoelectronic component according to independent claims 1 and 16. Advantageous embodiments and developments of the invention are the subject-matter of the dependent claims. Furthermore these objects are solved by an optoelectronic component according to independent claim 13. Advantageous embodiments and developments of the optoelectronic component are the subject-matter of dependent claims 14 and 15.

In at least one embodiment the method for producing a conversion element for an optoelectronic component comprises the following steps:

A) Producing a first layer, for that purpose:
A1) Providing a polysiloxane precursor material, which is liquid,
A2) Mixing a phosphor to the polysiloxane precursor material, wherein the phosphor is suitable for conversion of radiation,
A3) Curing the arrangement produced under step A2) to produce a first layer having a phosphor mixed in a cured polysiloxane material, which comprises a three-dimensional crosslinking network based primarily on T-units,
B) Producing a phosphor-free second layer, for that purpose:
B1) Providing the polysiloxane precursor material, which is liquid,
B2) Mixing a filler to the polysiloxane precursor material, wherein the filler is in a cured and powdered form, wherein the filler has a refractive index, which is equal to the refractive index of the cured polysiloxane material or equal to the refractive index of the precursor material e.g. a polysiloxane material,
B3) Curing the arrangement produced under step B2) to produce a second layer having a filler mixed in the cured polysiloxane material, which comprises a three-dimensional crosslinking network based primarily on T-units, wherein the produced conversion element is formed as a plate having a thickness of at least 100 µm.

Here and in the following, based primarily on T-units can mean that the ratio of T-units to all units, e.g. D-units, is greater than 80%.

Here and in the following, "the filler has an refractive index, which is equal to the refractive index of the cured polysiloxane material and/or equal to the refractive index of the precursor material" can mean that the refractive index of the filler is identical to the refractive index of the cured polysiloxane material and/or precursor material with respect to at least two positions behind the decimal point of the refractive index. For example, if the cured polysiloxane material has a refractive index of 1.43 then the filler has a refractive index of 1.43.

Here and in the following, the polysiloxane precursor materials as provided in steps A2 and/or B2 can be different or the same. For example, the polysiloxane precursor materials of steps A2 and/or B2 can differ in their organic content or alkoxy content. Alternatively, the polysiloxane precursor materials of steps A2 and/or B2 can have an identical composition.

Here and in the following, the cured polysiloxane materials in steps A3 and/or B3 can be different or the same.

Here and in the following, the filler can be made of the same cured polysiloxane material as mentioned in steps A3 and/or B3 or can be any other filler with an equal refractive index than the polysiloxane precursor. The filler is in a powdered form compared to the cured polysiloxane material mentioned in steps A3 and/or B3, which is mixed to the cured polysiloxane material mentioned in step B3.

Here and in the following, steps A1 to A3 are substeps of step A, Producing a first layer. Steps B1 to B3 are substeps of step B, Producing a second layer. Step A with its substeps A1 to A3 can be performed and subsequently Step B with its substeps B1 to B3 can be performed. Alternatively, Step B with its substeps B1 to B3 can be performed and subsequently Step A with its substeps A1 to A3 can be performed. Alternatively, a part of substeps A1 to A3 and B1 to B3, respectively, can be performed simultaneously.

In particular, the filler is a polysiloxane material in a cured and powdered form.

The invention further relates to an optoelectronic component.

In at least one embodiment the optoelectronic component comprises a semiconductor layer sequence. The semiconductor layer sequence is able to emit radiation. In particular, the semiconductor layer sequence emits radiation of the blue spectral range in operation. The optoelectronic component comprises a conversion element. The conversion element is preferably produced by a method according to claim 1. All stated definitions and embodiments of the method for producing a conversion element are therefore also applicable to the optoelectronic component and vice versa.

The conversion element is arranged directly on the surface of the semiconductor layer sequence. In particular the surface of the semiconductor layer sequence is the main surface, which means that this is the surface of the semiconductor layer sequence where most of the light is emitted. The conversion element comprises at least two layers, a first layer and a second layer. The first layer comprises a phosphor, which means at least one phosphor or a plurality of phosphors. One or a plurality of phosphors are mixed in a cured polysiloxane material or another filler with an equal refractive index than the polysiloxane precursor material.

The second layer comprises a filler. The filler is mixed in a cured polysiloxane material. The filler is the powdered and cured polysiloxane material or another filler with an equal refractive index than the polysiloxane precursor material or the polysiloxane material. In particular, the filler is identical in its composition with the cured polysiloxane material produced after step A3 or B3. The filler is powdered compared to the cured polysiloxane material produced after step A3 or B3.

In particular, the filler is the same material as the cured polysiloxane material mentioned in the second and/or first layer. The content of the filler in the phosphor-containing first layer is equal to the content of the filler in the second layer. In particular, the content of total filler in the phosphor-containing first layer is equal to the volume content of the filler in the second layer. Here "content" means in particular the volume percent with respect to the respective layers. The cured polysiloxane material in the first and second layers each comprises a three-dimensional crosslinking network. The three-dimensional crosslinking network is primarily based on T-units.

The inventors have found out that the methods for producing a conversion element as described herein produce a conversion element which has a lot of positive properties. The conversion element is formed as a plate having a thickness of at least 100 µm or 125 µm. In particular the thickness of the conversion element is in the range of 100 µm to 200 µm. The conversion element comprises at least two phosphors which are blended and result in a warm-white color temperature with a CRI of equal to or more than 90 (CCT<4100 K). Alternatively, a blend of at least two phosphors can be selected to result in a cool-white color temperature with a CRI of equal to or more than 90 (CCT≥4100 K).

The conversion element has a long-term stability under high incident blue light flux ($\geq 1.5$ A/mm$^2$). The conversion element has a long-term temperature stability (T>150° C.). The conversion element has a long-term stability against moisture.

Ceramic, single crystal and thin-film (e.g. PLD-grown) phosphors cannot produce the required spectrum from a single bound conversion element. Phosphor and silicone down-converters are not stable under the high heat and flux conditions. Phosphor-in-glass and phosphor-on-glass are the best alternatives in that the glass or glass-like phosphor matrix must be processable at temperatures below 350° C. and must be stable against moisture and demanding conditions. This is the challenge for known glass materials as produced according to this invention.

This invention makes it possible to prepare a photothermally stable down-conversion element or a conversion element, comprised of one or more inorganic phosphor materials dispersed in a highly crosslinked polysiloxane matrix or crosslinked polysiloxane matrix material arranged in a layered configuration such that the phosphor material is all located in close proximity to the chip or to the main surface of the semiconductor layer sequence.

The key advantages of this invention are:
the conversion element is thermally more stable than an analogue material based on a standard optical silicone matrix. This is due to the relatively low amount of organic material in the polysiloxane material compared to standard optical silicones. The thermogravimetric analysis plot shows how much organic material is present in one of the best low refractive index optical silicones used today in high-power applications compared to the disclosed polysiloxane material (see FIG.

2). The fully cured polysiloxane only has preferably about 15 wt % organic content, whereas the silicone reference has about 60 wt % organic content.

The highly crosslinked polysiloxane-based converter element can be made with cleaner or sharper edges than a screen-printed silicone-based converter. This is important for the titania-in-silicone side-cast reflector.

The down-conversion element can be made using an inexpensive process at room temperature.

Because the fabrication process does not require high temperatures or solvents, the conversion element is compatible with nearly all phosphors, so that different colors, from blue to red, including combinations, for example cool and warm-white blends, are possible. This is a key distinguishing feature from ceramic converters, where blends, for example warm white, are currently not possible.

Unlike the current phosphor-in-glass or phosphor-on-glass and nitride-based ceramic approaches, which rely on dicing to singulate the individual conversion elements, this technology is compatible with tape-casting and punching, which simplifies the manufacturing steps and reduces costs.

Unlike the current silicone-based down-conversion elements that are made with screen-printing or tape casted foils applied by vacuum forming lamination, this method produces parts that are more uniform in terms of brightness and color point because their thickness and surface roughness are better controlled.

Because the polysiloxane precursor material is a liquid, it is possible to incorporate different additives into the converter element such as nanoparticles, metal alkoxy precursors, organic molecules, polymers, etc. If additives are desired, they can serve different purposes, such as controlling the viscosity during fabrication, providing crack resistance and enhanced mechanical strength, tuning the refractive index, increasing thermal conductivity, etc.

A particular class of alkoxy methyl siloxane precursors lends itself to be used with or without a solvent. Some preferred embodiments use the solvent-free approach, which is a distinguishing factor from other materials that require solvent for one reason or another, for example to decrease viscosity to make them more processable, to dissolve solid materials to make them solution-proccesable, etc.

In one preferred embodiment, the phosphor-filled first layer and the phosphor-free second layer contain the same polysiloxane material or the same cured polysiloxane material. This results in strong chemical bonds being formed between the two layers, which means between the first and second layers, which is not necessarily the case if the phosphor-free layer were made of a different material.

According to one embodiment the polysiloxane precursor material in the first and/or second layer comprises the formula:

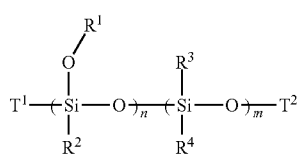

wherein T1 and T2 represent terminal groups, R1 to R4 each represent side groups, $0.8 \leq n \leq 1$, $0 \leq m < 0.2$ and $n+m=1$.

According to one embodiment the content of the phosphor in the first layer is equal or almost equal or similar to the content of the filler in the second layer. "Almost equal" or "similar" can mean that the volume content of the total filler in the phosphor-containing first layer differs from the content of the filler in the second layer by a maximum of 10%, 5%, 4%, 3%, 2%, 1% or 0.5%.

According to one embodiment the second layer is directly applied on the first layer, wherein the first and second layers are arranged on a surface of a semiconductor layer sequence of the optoelectronic component, wherein the conversion element at least partially absorbs the radiation of the semiconductor layer sequence of the optoelectronic component and comprises at least two layers.

The optoelectronic component comprises at least one optoelectronic semiconductor chip. The optoelectronic semiconductor chip can have the semiconductor layer sequence. The semiconductor layer sequence of the semiconductor chip is preferably based on a III-V compound semiconductor material. For example, this includes compounds from the elements consisting of indium, gallium, aluminium, nitrogen, phosphorus, arsenic, oxygen, silicon, carbon and combinations thereof. However, other elements and additions can also be used. The semiconductor layer sequence having an active region can be based, for example, on nitride compound semiconductor materials. In the present context, "based on nitride compound semiconductor material" means characterized in that the semiconductor layer sequence or at least a part thereof is a nitride compound semiconductor material, preferably $Al_nGa_mIn_{1-n-m}N$, or consists thereof, wherein $0 \leq n \geq 1$, $0 \geq m \geq 1$ and $n+m \leq 1$. This material does not necessarily have a mathematically exact composition according to the above formula. Rather, it can have, for example, one or more dopants and additional constituents. For the sake of simplicity, however, the above formula only contains the essential constituents of the crystal lattice (Al, Ga, In, N), even if these can be partially replaced and/or supplemented by small quantities of further substances.

The semiconductor layer sequence comprises an active layer having at least one pn-junction and/or having one or more quantum well structures. During operation of the LED or of the semiconductor chip, an electromagnetic radiation is generated in the active layer. A wavelength or a wavelength maximum of the radiation is preferably in the ultraviolet and/or visible and/or infrared spectral range, in particular at wavelengths between 420 and 800 nm inclusive, for example between 440 and 480 nm inclusive.

According to one embodiment the first layer has a thickness of 20 μm to 80 μm, in particular between 40 μm and 60 μm, for example 55 μm.

According to one embodiment the polysiloxane precursor material is a methyl methoxy polysiloxane having an methoxy content ranging from 10 wt % to 50 wt %.

According to one embodiment the polysiloxane precursor material is a methyl alkoxy polysiloxane having an alkoxy content ranging from 10 wt % to 50 wt %.

According to one embodiment the first and the second layers are applied by means of spray-coating, dip-coating, spin-coating, drop-casting, tape-casting or doctor blading.

According to one embodiment, the first and/or second layers are produced by tape-casting.

According to one embodiment the polysiloxane precursor material has a molecular weight of less than 5000 g/mol, preferably less than 1500 g/mol, preferably less than 1400 g/mol, 1300 g/mol, 1200 g/mol, 1100 g/mol 1000 g/mol or 900 g/mol.

According to one embodiment the first and/or second layers comprise fumed silica for increasing their viscosity.

According to one embodiment, the first and/or second layer comprise(s) fumed silica, wherein the content of the fumed silica is in the range of 5 wt % to 40 wt %, preferably between 20 wt % and 33 wt %, with respect to the cured polysiloxane material.

According to one embodiment the first and/or second layers are crosslinked to each other at their interface.

According to one embodiment the first and/or second layers are chemically crosslinked to each other at their interface forming a single crosslinked network.

According to one embodiment the method for producing a conversion element comprises a polysiloxane precursor material. The polysiloxane precursor material can be provided in steps A1 and/or B1. This precursor material can be different in each of the steps or can be the same material. The polysiloxane precursor material belongs to a particular class of siloxanes.

In particular, the precursor or polysiloxane precursor material is a low molecular weight alkoxy polysiloxane where the alkoxy content is in the order of about 35 wt %.

The polysiloxane precursor material is liquid. In particular, the polysiloxane precursor material is liquid at room temperature.

An ideal example structure of such a precursor material is shown as follows:

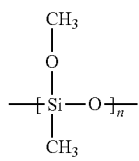

The number of repeat units n can vary and should be chosen so that the viscosity of the precursor is in the order of 1 to 80 mPas. The number of repeat units n can be: n=2-20.

When exposed to water, and typically a catalyst, the polysiloxane precursor material of step A1 and/or B1 undergoes hydrolysis and condensation reactions which crosslink the low molecular weight polysiloxane units into a dense polysiloxane network. In particular the cured polysiloxane material made from the polysiloxane precursor material comprises a three-dimensional crosslinking network primarily based on T-units. Additionally D-units can be present to increase the flexibility of the cured material. The ratio of T-units to all units, e.g. D-units, can be greater than 80%. The content of D-units to all units can be at most 20%.

In general polysiloxanes have different structural units, for example Q, T, D or M units. Each of them has different functions. M units terminate change or three-dimensional entities. A higher proportion of M units therefore results in a lower molecular mass of the silicone. The combination of D-units results in chains, while each of the Q-unit and T-unit is a branching point. A person skilled in the art knows what is meant by T-unit. A T-unit can mean here and in the following that one silicone atom has three bonds to three oxygen atoms. A D-unit can mean here and in the following that one silicone atom has two bonds to two oxygen atoms.

In reality not all of the methoxy groups necessarily result in crosslinking. Some of them can remain intact and some of them can be replaced by the silanol groups.

The following formula shows an example structure of a highly crosslinked cured polysiloxane material that can result from the hydrolysis and condensation of the polysiloxane precursor material. It should be noted that the structure is a schematic example that is easy to visualize but is not meant to be technically accurate.

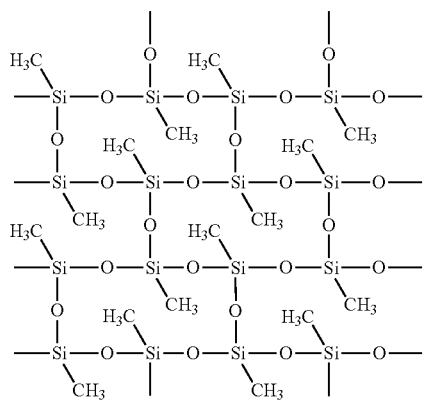

According to one embodiment fumed silica is added to the polysiloxane precursor material. The fumed silica increases the viscosity, reduces shrinkage during curing and makes a slurry for a down-conversion layer. Once the fumed silica is roughly incorporated, the desired phosphor powder or blend of the phosphor powders are dispersed in the liquid polysiloxane precursor material as well.

If desired, other additives, for example nanoparticles, can also be added to the liquid polysiloxane precursor material.

Typically a catalyst, for example a titanium alkoxide, is added in the range of 1 wt % to 5 wt % of the polysiloxane material, cured polysiloxane material or polysiloxane resin. The relative amounts of phosphor and additives depend on many criteria, such as the size of the particles, the desired color point, the volume and thickness of the conversion layer, the wavelength of exciting radiation, the type of pump, for example laser or LED, the amounts of other additive materials and other considerations.

According to one embodiment the fumed silica can also be added to the second layer, which is the phosphor-free layer, to make the slurry for the phosphor-free layer. The fumed silica increases the viscosity.

If desired, other additives can also be added to the liquid polysiloxane precursor material which is provided in step B1. Typically a catalyst such as a titanium alkoxide is added in the range of 1 wt % to 5 wt % of the cured polysiloxane material or polysiloxane resin. The relative amount of the fumed silica, catalyst or perhaps other additives depends on many criteria such as the desired viscosity, the desired transparency and the desired thickness, among others.

According to one embodiment the converter element is formed as a multilayer structure. The phosphor-containing slurry can be dispensed by any of a number of techniques such as spray-coating, dip-coating, spin-coating, drop-casting, tape-casting or doctor blading. It can be dispensed on a permanent substrate, a temporary substrate or on the LED itself.

In one embodiment the first layer is only partially cured in step A3, and the phosphor-free second layer can be dispensed over the top by any of the methods listed above. In the presence of humidity or if liquid water was added to the precursor solution, the mixture will begin to cure at room temperature. If desired, curing can be accelerated by applying increased temperature. The two layers of the conversion element can form onto one material held tightly together by a highly crosslinked polysiloxane network. Even so, there is only one polysiloxane network with that the conversion element can retain its layer structure with the phosphor particles all being located near each other in one portion of the material.

According to one embodiment, the conversion element produced by a method as claimed in claim 1 can be punched or diced to the proper shape and size and incorporated into the optoelectronic component, for example a light-emitting diode package or laser-activated module.

According to one embodiment the polysiloxane precursor material as provided in step Al or BI is a methyl methoxy polysiloxane. The methoxy content can be in the order of 10 to 50 wt %, preferably in the range of 15 to 45 wt %, even more preferably in the range of 25 to 40 wt %. The molecular weight of the polysiloxane precursor material can be such that the viscosity is in the range of 1 to 80 mPas, but preferably in the range of 2 to 40 mPas.

For a lighting application that requires high CRI (>90) the conversion element can comprise at least two phosphors. The phosphor mixture can be a blend of cerium-activated lutetium aluminum garnet $(Lu_{1-x}Ce_x)_3Al_5O_{12}$ wherein $0<x\leq0.2$ and the europium-activated calcium aluminum silicone nitride, $(Ca_{1-x}Eu_x)AlSiN_3$ where $0<x\leq0.2$. The concentration and ratio of the phosphors depends on the cerium and europium concentrations of phosphors absorptances and quantum efficiency, the target thickness, the target color point and whether there are other scattering additives present. The ratio of garnet to nitride phosphor can be within the range of 2.1:1 to 4.5:1.

According to one embodiment at least two phosphors, fumed silica and the polysiloxane precursor material, are added to form a first layer. The content of the fumed silica is preferably in the range of 5 to 35 wt %. The content of the two phosphors is in the range of 20 to 80 wt %. The content of the polysiloxane precursor material is in the range of 10 to 75 wt %. After being thoroughly mixed, 1 to 5 wt % (of the polysiloxane resin or cured polysiloxane material or polysiloxane) tetra-n-butyl titanate is added as a catalyst. A separate phosphor-free second layer mixture can be produced in parallel with the same polysiloxane precursor material, for example in the range of 65 to 95 wt %, fumed silica, for example in the range of 5 to 35 wt %, and tetra-n-butyl titanate catalyst.

The phosphor-containing precursor mixture for forming the first layer can then be tape-casted on, for example, a non-stick polymer sheet such as silicone-coated Mylar. Mylar is a trade name of DuPont for a polyethylene terephthalate polyester film (BOPET: biaxially oriented polyethylene terephthalate). The target thickness of this layer in the final cured state of the first layer can be in the order of 10 µm to 100 µm, but preferably between 25 µm and 75 µm. Before this first layer has been completely cured the phosphor-free precursor mixture can be tape-casted over the first layer. The overall thickness of both layers in the final cured state of the conversion element can be in the order of 100 to 250 µm, but more preferably between 120 and 250 µm. The two-layer tape is then allowed to cure at room temperature in ordinary ambient conditions. The curing time depends on the thickness of the tape, the amount of catalyst and the relative humidity. Typically the material forms a skin within an hour but requires a longer time for the full.

According to one embodiment, once cured the multi-layer conversion elements are punched out of the tape using, for example, a numerical control (NC) punch tool. Once punched, the individual platelets are ready to be incorporated into an optoelectronic component, for example into a light device based on a light-emitting diode, LED, or a laser diode (LD).

According to one embodiment the cured polysiloxane material is a highly crosslinked network primarily made of siloxane bonds. The siloxane network is formed from a liquid or solution-based siloxane precursor. The generic formula for the reactive polysiloxane precursor is shown below:

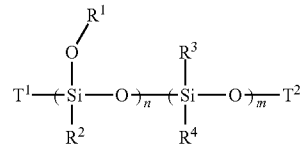

wherein T1 and T2 represent terminal groups, R1 to R4 each represent side groups, $0.8\leq n\leq 1$, $0\leq m<0.2$ and $n+m-1$.

In some embodiments the R- and T-groups can all be the same, for example a methyl group. In other embodiments each functional group can be a different group. In another embodiment some of the groups can be the same and some can be different. In some cases one of the groups can be made up of more than one functional group. For example, one embodiment can involve a precursor material where $m=0$, $R^1$=methyl, and $R^2$ is a combination of methyl and phenyl.

According to one embodiment the polysiloxane precursor material can be a methyl methoxy polysiloxane where the methoxy content ranges from 10 wt % to 50 wt %, but is preferably closer to 15 wt % to 45 wt %, even more preferably to 25 wt % to 40 wt %. The structure can be like what is shown above, but it can also be another combination of a polysiloxane backbone with metyl and methoxy side groups.

For example there can be silicone atoms with two methyl groups or two methoxy groups as long as the total methoxy content falls within the ranges above. The number of siloxane monomer units in the polysiloxane precursor material can be such that the viscosity is in the order of 1 to 150 mPas but preferably in the range of 1 to 60 mPas and even more preferably in the range of 2 to 40 mPas. The polysiloxane precursor material, also called precursor, can also be partially reacted like the following example, but non-limiting, formula:

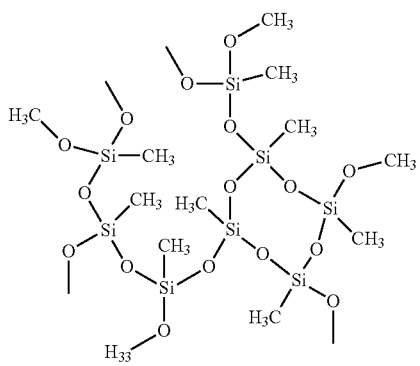

In a partially reacted precursor the methoxy content can be lower than in the pristine, unreacted precursor and viscosity can tend to be higher.

According to one embodiment the terminal groups of the polysiloxane precursor material can contain one or more chemical reactive groups such as alkoxy, vinyl, hydroxyl, carboxylic acid, ester, or any other of the reactive functional groups know from the organic chemistry field.

According to another embodiment the terminal groups can be less reactive such as hydrogen, methyl, ethyl or any alkyl or aryl groups.

According to one embodiment methyl and methoxy side groups are preferred. This does not exclude other functional groups such as ethyl, ethoxy, phenyl, phenoxy, vinyl, trifluoropropyl.

According to one embodiment m=0, $R^2$ is either a methyl, a phenyl or a combination of the two, and $R^1$=ethyl with an ethoxy content of 10 to 50 wt %, but more preferably 20 to 30 wt %, and/or a viscosity in the range of 30 to 70 mPas. A small amount of solvent can be present in this embodiment.

According to an embodiment m=0, $R^2$ is a combination of methyl and phenyl, and $R^1$ is a methyl group. The methoxy content is 10 to 20 wt % along with a viscosity of 100 to 50 mPas.

The precursor or the polysiloxane precurs& material can instead be based on a polysilazane precursor, which has a chemical backbone of alternating silicone and nitrogen atoms. The side groups can be hydrogen or any of those listed above. In the presence of water, the polysilazane can react to form a dense polysiloxane network similar to that formed from the siloxane-based precursors.

According to one embodiment the optoelectronic component or the first layer of the optoelectronic component comprises at least two different phosphors. The first phosphor is able to emit red radiation. The second phosphor is able to emit green radiation. In particular the optoelectronic component emits warm white light in operation.

According to one embodiment of the optoelectronic component the first layer comprises two sublayers. The two sublayers are stacked one on top of the other. The first sublayer of the two sublayers is arranged directly on the surface of the semiconductor layer sequence and comprises the phosphor emitting red radiation in operation. The second sublayer is arranged directly on the first sublayer and comprises a further phosphor emitting green radiation in operation.

According to one embodiment the conversion element comprises two layers wherein the same cured polysiloxane material is used in both layers and the crosslinked siloxane network is continuous from one layer to the other. The layering is achieved by having all of the phosphor particles in a densely packed area. In this embodiment the phosphor-free second layer can also be transparent. The total thickness can be greater than 150 μm and the phosphor-containing second layer can account for >50% of the total thickness.

According to an embodiment the phosphor-free second layer can be made to act as a diffusor by adding some scattering particles. Scattering particles can be, for example, aluminum oxide, titanium dioxide or silicone dioxide.

According to one embodiment the conversion element comprises three layers. The three layers comprise the same cured polysiloxane material in all layers. The three layers are crosslinked and form a crosslinked siloxane network. The crosslinked siloxane network is continuous from one layer to the next. The total thickness can be greater than 120 μm. This multilayer design can be any configuration of the three layers.

According to one embodiment the conversion element comprises more than three, for example four and more, layers. These layers can be differently combined with different phosphor layers, clear layers and diffusive layers.

The cured polysiloxane material does not need to have the same composition from layer to layer. For example, the cured polysiloxane material in the phosphor-containing layer can be one that contains phenyl groups for the purpose of having a higher refractive index for better light outcoupling. The clear layer (layer without a phosphor) can be based on a polysiloxane with a lower refractive index, which can provide an index step that is closer to air, which can also help with light extraction.

According to one embodiment the phosphor-containing first layer is still based on a polysiloxane material, while the phosphor-free second layers are not necessarily made from polysiloxanes. For example the phosphor-layers comprises glass, quartz, sapphire, patterned sapphire, traditional optical silicones, etc.

According to one embodiment the top surface of the multilayer conversion element can be structured for light extraction. The top surface can be flat but it can also be structured by incorporating random roughness, microlenses or other micro-optics, photonic crystals, plasmonic arrays, meta lenses, aperiodic nanostructured arrays, dielectric films or stacks of dielectric films, for example anti-reflective coatings, dichroic filters, wavelength/angle-dependent pass filters, graded index anti-reflective coatings. These surface modifications can be implemented or imparted by starting with a structured/patterned substrate and casting the top layer first, or by post-processing steps.

According to another embodiment any or all of the layers are glued together with an adhesive.

According to one embodiment the at least one phosphor can be selected from the group consisting of:
$(RE_{1-x}Ce_x)_3(Al_{1-y}A'_y)_5O_{12}$ with $0<x\leq0.1$ and $0\leq y\leq1$,
$(RE_{1-x}Ce_x)_3(Al_{5-2y}Mg_ySi_y)O_{12}$ with $0<x\leq0.1$ and $0\leq y\leq2$,
$(RE_{1-x}Ce_x)_3Al_{5-y}Si_yO_{12-y}N_y$ with $0<x\leq0.1$ and $0\leq y\leq0.5$,
$(RE_{1-x}Ce_x)_2CaMg_2Si_3O_{12}:Ce^{3+}$ with $0<x\leq0.1$,
$(AE_{1-x}Eu_x)_2Si_5N_8$ with $0<x\leq0.1$,
$(AE_{1-x}Eu_x)AlSiN_3$ with $0<x\leq0.1$,
$(AE_{1-x}Eu_x)_2Al_2Si_2N_6$ with $0<x\leq0.1$,
$(Sr_{1-x}Eu_x)LiAl_3N_4$ with $0<x\leq0.1$,
$(AE_{1-x}Eu_x)_3Ga_3N_5$ with $0<x\leq0.1$,
$(AE_{1-x}Eu_x)Si_2O_2N_2$ with $0<x\leq0.1$,
$(AE_xEu_y)Si_{12-2x-3y}Al_{2x+3y}O_yN_{16-y}$ with $0.2\leq x\leq2.2$ and $0<y\leq0.1$,
$(AE_{1-x}Eu_x)_2SiO_4$ with $0<x\leq0.1$,
$(AE_{1-x}Eu_x)_3Si_2O_5$ with $0<x\leq0.1$,
$K_2(Si_{1-x-y}Ti_yMn_x)F_6$ with $0<x\leq0.2$ and $0<y\leq1-x$,
$(AE_{1-x}EU_x)_5(PO_4)_3Cl$ with $0<x\leq0.2$, $(AE_{1-x}Eu_x)Al_{10}O_{17}$ with $0<x\leq0.2$ and combinations thereof, wherein RE is one or more of Y, Lu, Tb and Gd; AE is one or more of Mg, Ca, Sr, Ba; A' is one or more of Sc and Ga; wherein the phosphors optionally include one or more of halides.

According to one embodiment the conversion element can comprise nanoparticles. The nanoparticles can be added to any of the layers in the multilayer converter element to change properties such as the refractive index or thermal conductivities. The nanoparticles can be oxides, for example $SiO_2$, $ZrO_2$, $TiO_2$, $Al_2O_3$, ZnO; nitrides, for example AlN, $Si_3N_4$, BN, GaN; carbon-based nanoparticles, for example carbon nanotubes, graphene and their derivatives; heteropolyacids, for example 12-tungstophosphoric acid ($H_3PW_{12}O_{40}$) or 12-tungstosilicic acid ($H_4SiW_{12}O_{40}$).

In some cases, to make them compatible, the surfaces of the inorganic nanoparticles are modified with capping agents to make them miscible with the precursor compounds. The nanoparticles can be metal-organic compounds such as alkoxides of silicone, zirconium, titanium, aluminum, and/or halfnium; organic molecules, for example adhesion promoters, plasticizers, de-foamers, thickeners, thinners or polymers, for example organic (carbon based chain) or inorganic (non-carbon based chain). Some non-exclusive examples can be poly(dimethyl siloxane), poly(methylphenyl siloxane), poly(diphenyl siloxane), poly(silphenylcne-siloxane), polyphosphazenes, polysilazane, perhydropolysilazane.

According to one embodiment the optoelectronic component is an organic or inorganic light-emitting device. In particular the optoelectronic component is an inorganic light-emitting device, LED. The LED can be of the chip-on-board type or of the package LED type. The converter element can be deposited directly on the LED, it can be glued in close proximity to the LED or it can be in a remote configuration. The optoelectronic component can also be a laser diode.

The invention further relates to a method for producing a conversion element for an optoelectronic component comprising the steps of:

A) Providing a first carrier, selected from glass, sapphire, or patterned sapphire, B) Applying a first connecting layer on the first carrier, wherein the first connecting layer comprises a silicone or is produced by a polysiloxane precursor material comprising the formula:

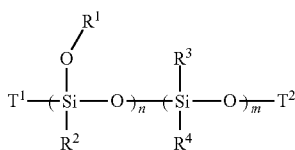

wherein T1 and T2 represent terminal groups, R1 to R4 each represent side groups, $0.8\leq n\leq 1$, $0\leq m<0.2$ and $n+m=1$, and C) Applying a conversion element on the first connecting element, e.g. by means of tape casting, wherein the conversion element is formed as a foil and comprises a phosphor mixed in a cured polysiloxane material, which is produced by a polysiloxane precursor material comprising the formula:

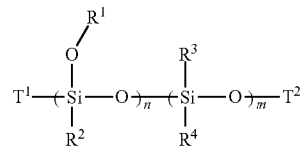

wherein T1 and T2 represent terminal groups, R1 to R4 each represent side groups, $0.8\leq n\leq 1$, $0\leq m<0.2$ and $n+m=1$.

Additionally and/or optionally, the method can comprise a step D):

D) Applying a second connecting layer on the conversion element, wherein the second connecting layer comprises a silicone or is produced by a polysiloxane precursor material comprising the formula:

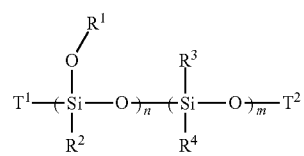

wherein T1 and T2 represent terminal groups, R1 to R4 each represent side groups, $0.8\leq n\leq 1$, $0\leq m<0.2$ and $n+m=1$.

Additionally and/or optionally, the method can comprise a step E) after step D):

E) Applying a second carrier on the second connecting element, wherein the first and/or second carrier comprise(s) sapphire, glass or a patterned sapphire substrate.

This patent application refers to the PCT application WO 2017/182390 A1, whose disclosure content of the polysiloxane precursor material and the cured polysiloxane material is hereby incorporated by reference.

Further advantageous embodiments and developments will become apparent from the exemplary embodiments described below in conjunction with the figures.

DETAILED DESCRIPTION OF THE EMBODIMENTS

Figure 1A:
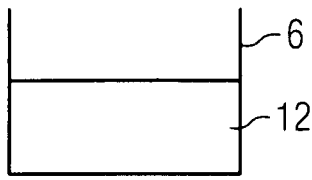
FIGS. 1A to 1I show a schematic illustration of a method for producing a conversion element for an optoelectronic component according to an embodiment.
Figure 1B:
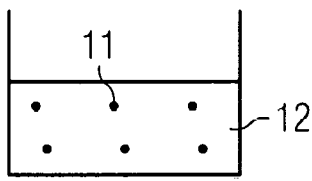
Figure 1C:

In the exemplary embodiments and figures identical or identically acting elements can in each case be provided with the same reference symbols. The elements illustrated and their size relationships to one another are not to be regarded as true to scale. Rather, individual elements such as, for example, layers, components, devices and regions, can be represented with an exaggerated size for better representability and/or for a better understanding.

FIG. 1 shows a method for producing a conversion element for an optoelectronic component. According to FIG. 1A a polysiloxane precursor material 12 for producing a first layer 1 is provided. The polysiloxane precursor material 12 is liquid and is provided in a reservoir or tank 6. Then, the at least one phosphor or plurality of phosphors 11 is/are mixed to the polysiloxane precursor material 12 as shown in FIG. 1B. Then this mixture is tape-casted as shown in FIG. 1C and cured to produce a first layer 1 having a phosphor or at least one phosphor 11 mixed in a cured polysiloxane material 13, which comprises a three-dimensional crosslinking network primarily based on T-units.

Figure 1D:
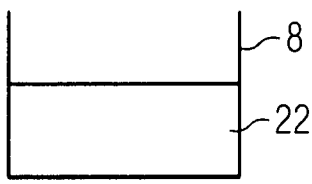
Figure 1E:
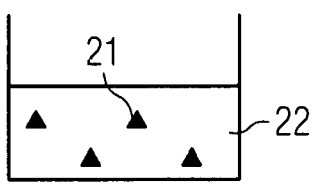
Figure 1F:
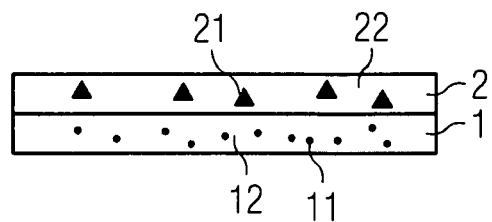
Figure 1G:
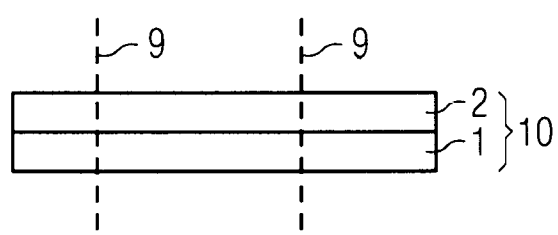

According to FIG. 1D a polysiloxane precursor material 22 is provided in a tank 8. The polysiloxane precursor material 22 can be the same as the polysiloxane precursor material 12 or different from the latter. A filler 21 is mixed to the polysiloxane precursor material 22 in step B2 (see FIG. 1E). This arrangement produced under step B2 is cured to produce a second layer 2. The second layer 2 has a filler 21 which is mixed in the cured polysiloxane material 22. The cured polysiloxane material 22 comprises the three-dimensional crosslinking network with the T-unit. As shown in FIG. 1F, the second layer 2 is directly applied on the first layer 1. As shown in FIG. 1G, the produced conversion element 10 can be diced 9. The conversion element 10 is, in particular, formed as a plate and has a thickness of at least 100 µm or 125 µm.

Figure 1H:
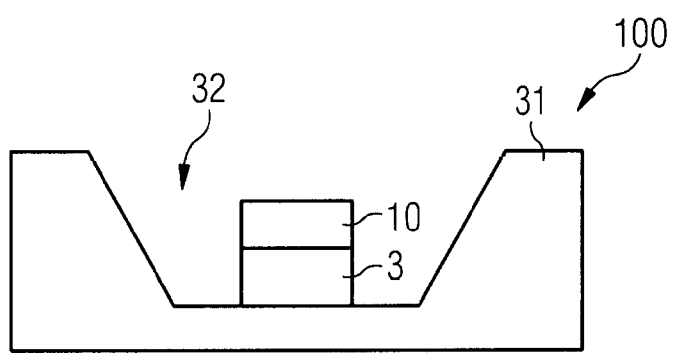

FIG. 1H shows a side view of an optoelectronic component 100 having a housing 31. The housing 31 comprises a recess 32 in which an LED chip 3 or semiconductor layer sequence 3 is arranged. On the semiconductor layer sequence 3 the conversion element 10 is directly applied. The conversion element 10 can be placed on the surface of the semiconductor layer sequence 3 by the so-called pick-and-place process.

Figure 1I:
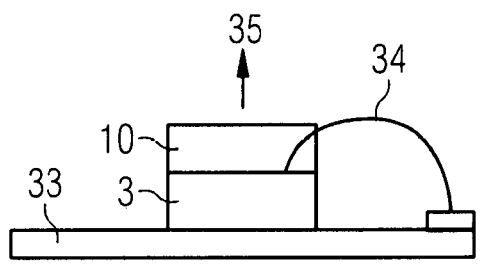

FIG. 1I shows a schematic side view of an optoelectronic component 100 according to an embodiment. The optoelectronic component 100 comprises a carrier 33, a semiconductor layer sequence 3, a conversion element 10, a bonding wire and bonding pad 34. The semiconductor layer sequence 3 emits radiation in the direction of reference number 35. The conversion element 10 covers the bonding wire 34 completely in the direction of the radiation direction 35 of the semiconductor layer sequence. This radiation direction 35 is also called the main radiation direction, which means in particular the direction of the radiation where the major share of the light is emitted.

Figure 2:
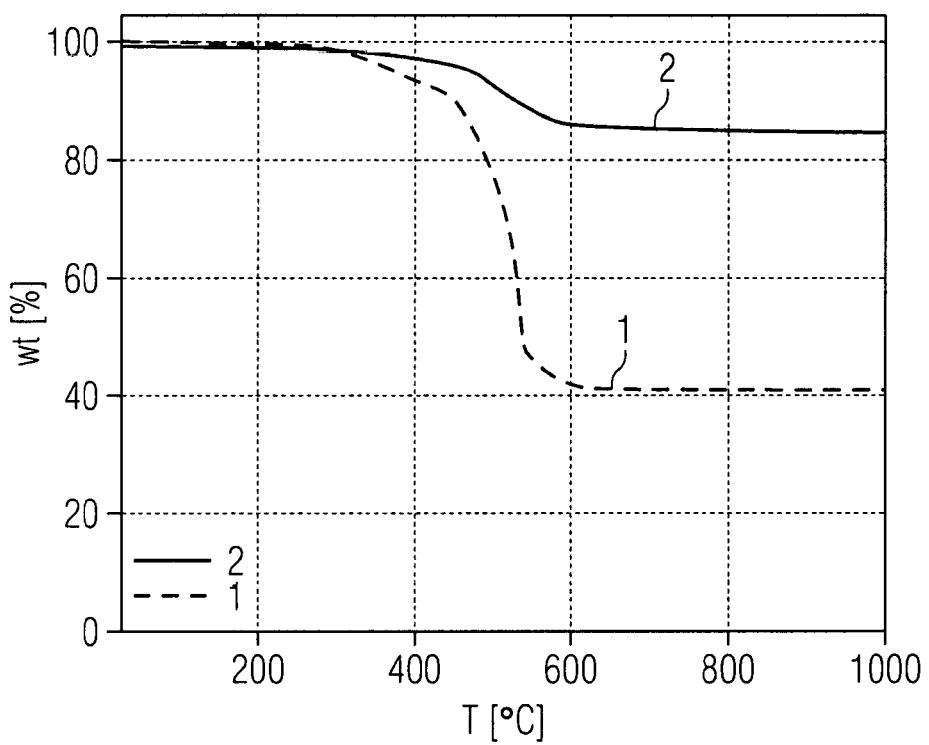
FIG. 2 shows a thermogravimetric analysis profile according to one embodiment and exemplary embodiments.

FIG. 2 shows a thermogravimetric analysis profile of a methyl-based silicone reference 1 and a cured polysiloxane material 2 (methyl-based polysiloxane). The standard silicone 1 loses almost 60% of its weight, indicating a large organic content. The polysiloxane material 2 loses less than 20% of its weight, indicating a significantly lower organic content. The thermogravimetric analysis shows how much organic material is present in one of the best low-refractive-index optical silicones used today in high-power applications compared to the disclosed polysiloxane material. The fully cured polysiloxane only has about 15 wt % organic content, whereas the silicone reference has about 60 wt % organic content.

FIGS. 3A to 3D show the schematic example of multi-layered conversion elements according to one embodiment.

Figure 3A:
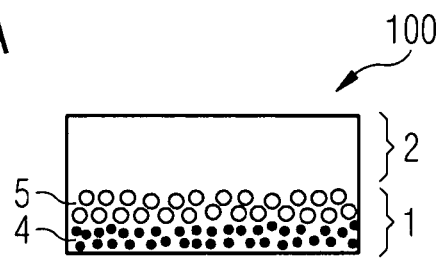
FIGS. 3A to 3D each show a schematic illustration of an optoelectronic component according to an embodiment.

As shown in FIG. 3A the optoelectronic component 100 shows a first layer 1 comprising two sublayers 4 and 5. The first sublayer 4 comprises, for example, a phosphor emitting red radiation and the second sublayer comprises a further phosphor emitting green radiation or vice versa. The first sublayer 4 is directly arranged on the second sublayer 5. Above the second sublayer 5 a second layer, which is phosphor-free or also called a clear layer, is arranged.

Figure 3B:
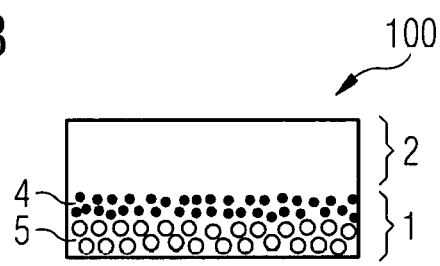

According to FIG. 3B the first and second sublayers 4, 5 are interchanged compared to the optoelectronic component 100 according to FIG. 3A.

Figure 3C:
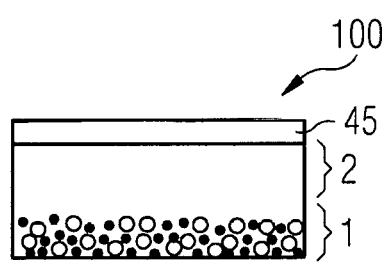

The optoelectronic component 100 according to FIG. 3C comprises a first layer 1. The first layer 1 comprises two different kinds of phosphors, for example a red-emitting and a green-emitting phosphor. The phosphors are mixed and dispersed in the cured polysiloxane material. The optoelectronic component 100 comprises a second layer 2 which is arranged on the first layer 1. A diffusive layer 45 is arranged on the second layer 2. The diffusive layer 45 can comprise, for example, scattering particles like titanium dioxide.

Figure 3D:
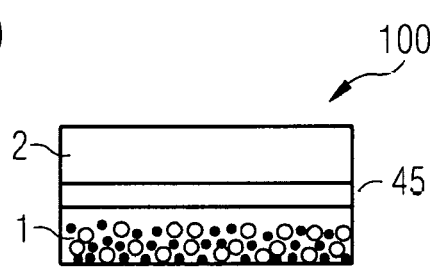

The optoelectronic component 100 according to FIG. 3D shows a first layer 1 in which two different phosphors are mixed. Above the first layer 1 a diffusive layer 45 is arranged. Above the diffusive layer 45 a second layer, which is phosphor-free, is arranged. In other words, the diffusive layer 45 is arranged between the first and the second layer 1, 2.

Figure 4A:
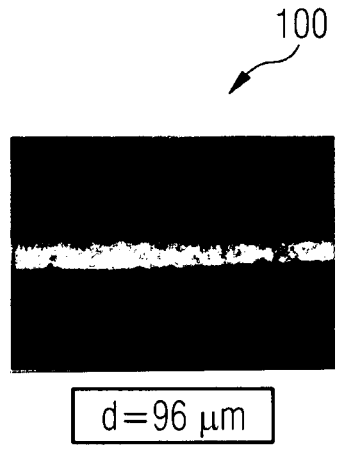
FIGS. 4A to 4E each show a microscopic image of an optoelectronic component according to an embodiment.
Figure 4B:
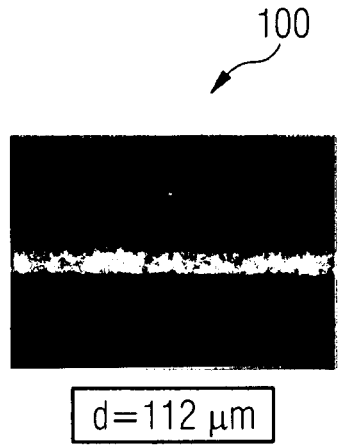
Figure 4C:
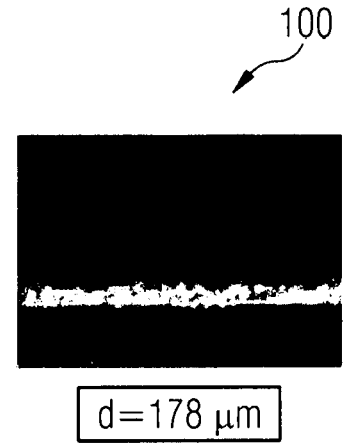

FIGS. 4A to 4E each show microscopic images of optoelectronic components according to one embodiment. The images show the first and second layers and the total thicknesses d of 96 µm (FIG. 4A), of 112 µm (FIG. 4B) and of 178 µm (FIG. 4C).

Figure 4D:
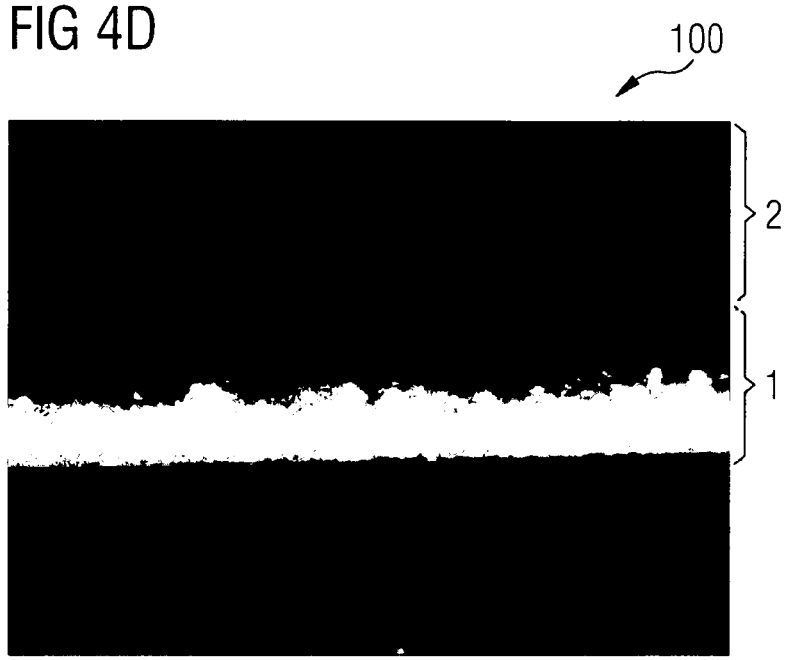
Figure 4E:
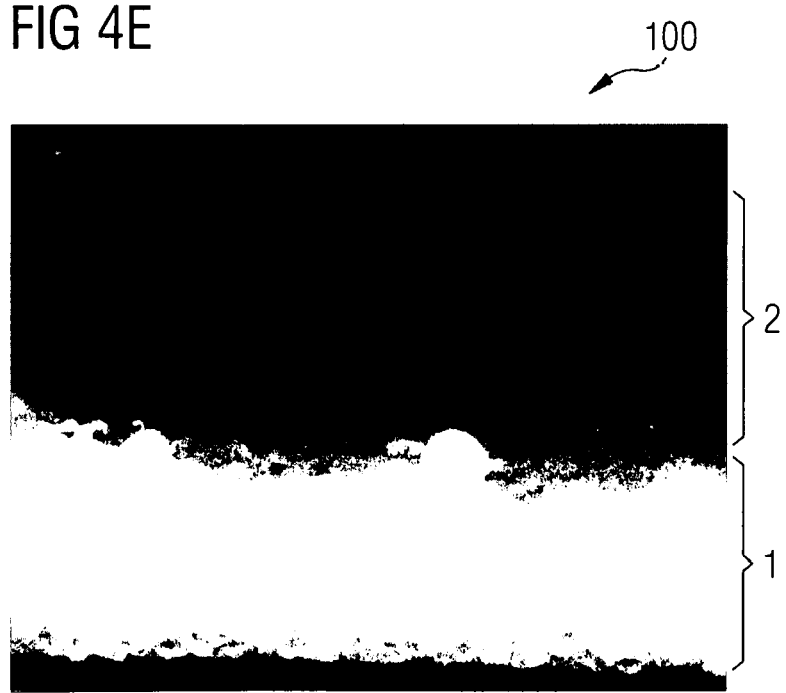

In particular the images of FIGS. 4D and 4E each show the filler in the phosphor-free second layer 2. The filler is cured and in powdered form. In particular the content of the filler is equal to the content of the phosphor in the first layer. Equal means that the content is identical with a maximum tolerance of 0, 1, 3, 4 or 5 percent of this value. FIG. 4E shows that the thickness of the first layer 1, e.g. 50 µm, is smaller than the thickness of the second layer 2, e.g. 75 µm.

Figure 5:
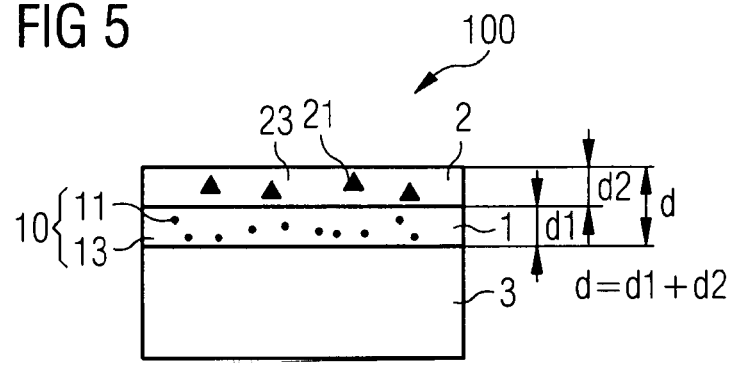
FIG. 5 shows a schematic illustration of an optoelectronic component according to an embodiment.

FIG. 5 shows a schematic illustration of an optoelectronic component 100 according to an embodiment. The optoelectronic component 100 comprises a semiconductor layer sequence 3. A conversion element 10 is arranged on the semiconductor layer sequence 3. The conversion element 10 comprises a first layer 1 and a second layer 2. The first layer 1 comprises the cured polysiloxane 13 and the phosphor 11. The second layer 2 comprises the cured polysiloxane 23 and the filler 21. The first layer 1 has a thickness d1. The second layer 2 has a thickness d2. The sum of the thicknesses d1 and d2 is the total thickness d of the conversion element 10.

Figure 6:
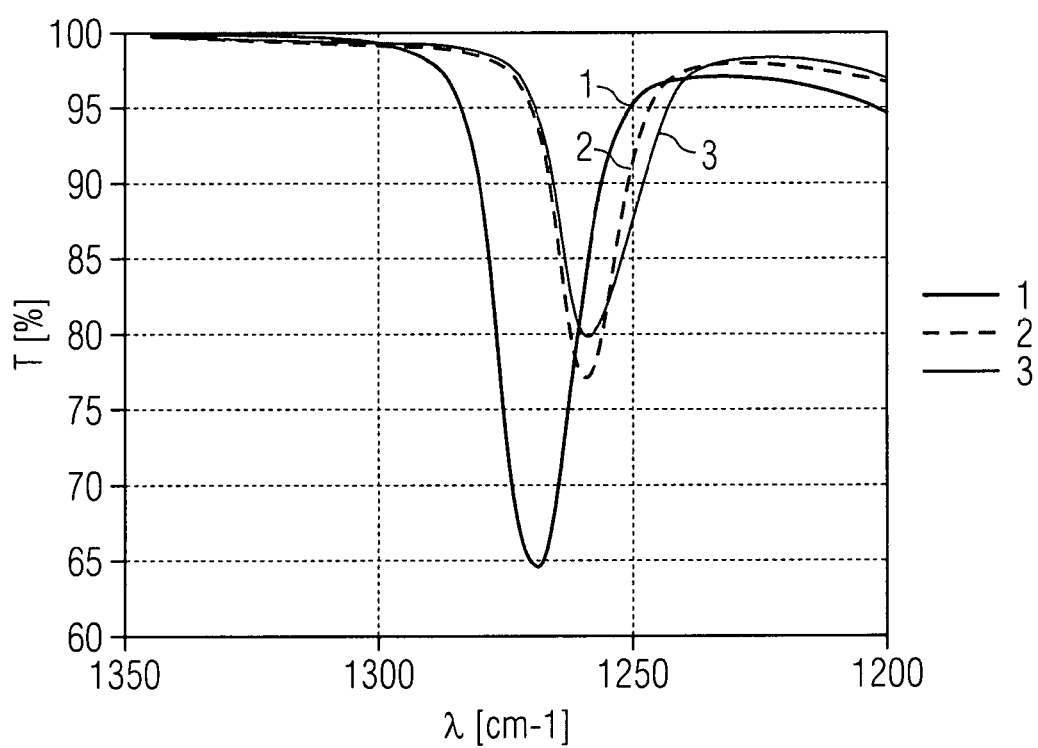
FIG. 6 shows the transmission of polysiloxane, methyl silicone and phenyl silicone.

FIG. 6 shows the FTIR spectrum of polysiloxane 1, typical methyl silicone 2 and typical phenyl silicone 3. The transmission in percent is shown as the function of the wavelength in 1/cm. There is a distinct difference between the position of the Si—O-vibration in the IR-spectrum of M, D, and T Q-units; FIG. 6 shows the Si—O-vibration of D-units (silicone, references 2 and 3) and T-units (polysiloxane, reference 1). The difference between T-units and D-units can be determined via FTIR.

Figure 7A:
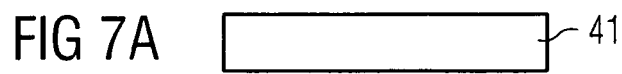
FIGS. 7A to 7E show the method for producing a conversion element for an optoelectronic component according to one embodiment.
Figure 7B:
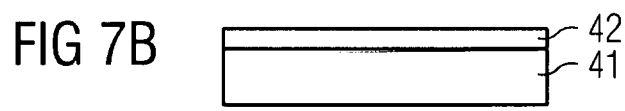
Figure 7C:
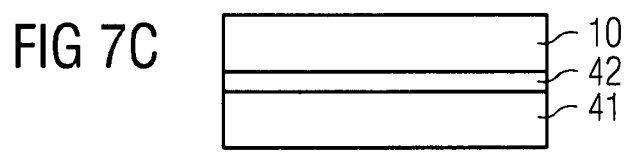
Figure 7D:
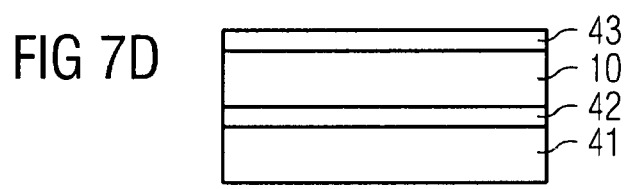
Figure 7E:
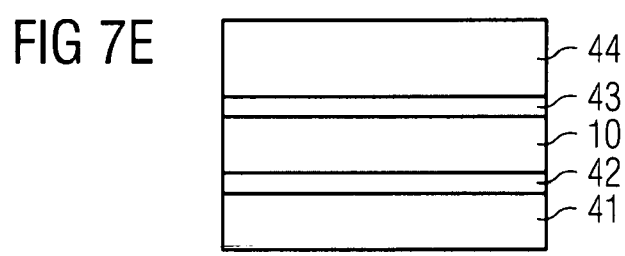

FIGS. 7A to 7E show the method for producing a conversion element or an optoelectronic component according to one embodiment. As shown in FIG. 7A a first carrier 41 is provided. The first carrier 41 can comprise sapphire, glass or a patterned sapphire substrate (PSS).

On the first carrier 41 the first connecting layer 42 is applied, wherein the first connecting layer 42 comprises a silicone or is produced by a polysiloxane precursor material as mentioned above. Then a conversion element 10 is applied on the first connecting element 42 by means of tape-casting. The conversion element 10 is preferably formed as a foil and comprises a phosphor or at least one phosphor mixed in a cured polysiloxane material. The cured polysiloxane material is produced by a polysiloxane precursor material as mentioned above.

Optionally, a second connecting element 43 is applied on the conversion element 10. The second connecting layer 43 comprises a silicone or is produced by a polysiloxane precursor material as mentioned above. Then the second connecting element 43 can be applied on a surface of a semiconductor layer sequence.

Optionally and alternatively, a second carrier 44 can be applied on the second connecting element 43. The second carrier 44 can comprise sapphire, glass or a patterned sapphire substrate (PSS).

The exemplary embodiments described in conjunction with the figures and the features thereof can also be combined with one another in accordance with further exemplary embodiments, even if such combinations are not explicitly shown in the figures. Furthermore, the exemplary embodiments described in conjunction with the figures can have additional or alternative features according to the description in the general part.

The invention is not restricted to the exemplary embodiments by the description on the basis of the exemplary embodiments. Rather, the invention comprises any new feature and any novel combination of features, which includes in particular any combination of features in the patent claims, even if this feature or this combination itself is not explicitly specified in the patent claims or exemplary embodiments,

LIST OF REFERENCE NUMERALS 1 first layer
2 second layer
3 semiconductor layer sequence
4 first sublayer
5 second sublayer
6 tank or reservoir
7 silicone pad foil
8 tank
9 dicing
10 conversion element
11 phosphor
12 polysiloxane precursor material or precursor
13 cured polysiloxane material
21 filler
22 polysiloxane precursor material or precursor
23 cured polysiloxane material
31 housing
32 recess
33 carrier
34 bonding wire and/or bonding pad
35 radiation of the semiconductor layer sequence
41 first carrier
42 first connecting element
43 second connecting element
44 second carrier
45 diffusive layer
100 optoelectronic component

What is claimed is:

1. A method for producing a conversion element for an optoelectronic component comprising the steps of:
A) providing a first carrier, selected from glass, sapphire, or patterned sapphire,
B) applying a first connecting layer on the first carrier, wherein the first connecting layer comprises a silicone or is produced by a polysiloxane precursor material comprising the formula:

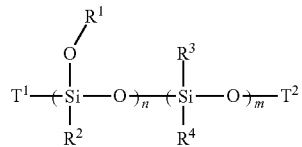

wherein T1 and T2 represent terminal groups, R1 to R4 each represent side groups. $0.8 \leq n \leq 1$, $0 \leq m < 0.2$ and $n+m=1$, and C) applying a conversion element on the first connecting element, wherein the conversion element is formed as a foil and comprises a phosphor mixed in a cured polysiloxane material, which is produced by polysiloxane precursor material comprising the formula:

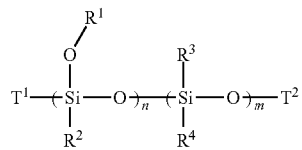

wherein T1 and T2 represent terminal groups, R1 to R4 each represent side groups, $0.8 \leq n \leq 1$, $0 \leq m \leq 0.2$ and $n+m=1$.

2. The method according to claim 1,
wherein the conversion element is applied on the first connecting element by means of tape-casting.

3. The method according to claim 1,
wherein the method comprises a step D):
D) applying a second connecting layer on the conversion element, wherein the second connecting layer comprises a silicone or is produced by a polysiloxane precursor material comprising the formula:

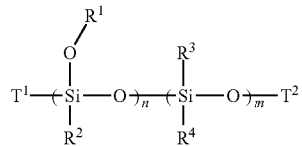

wherein T1 and T2 represent terminal groups, R1 to R4 each represent side groups, $0.8 \leq n \leq 1$, $0 \leq m < 0.2$ and $n+m=1$.

4. The method according to claim 3,
wherein the second connecting element is applied on a surface of a semiconductor layer sequence.

5. The method according to claim 3,
wherein the method comprises a step E) after step D):
E) applying a second carrier on the second connecting element, wherein the first and/or second carrier comprise(s) sapphire, glass or a patterned sapphire substrate.

6. A method for producing a conversion element for an optoelectronic component comprising the steps of:
   A) producing a first layer, for that purpose:
   A1) providing a polysiloxane precursor material, which is liquid,
   A2) mixing a phosphor to the polysiloxane precursor material, wherein the phosphor is suitable for conversion of radiation,
   A3) curing the arrangement produced under step A2) to produce the first layer having a phosphor mixed in a cured polysiloxane material, which comprises a three-dimensional crosslinking network based primarily on T-units, where the ratio of T-units to all units is greater than 80%,
   B) producing a phosphor-free second layer, for that purpose:
   B1) providing the polysiloxane precursor material, which is liquid,
   B2) mixing a filler to the polysiloxane precursor material, wherein the filler is in a cured and powdered form, wherein the filler has a refractive index, which is equal to the refractive index of the cured polysiloxane material,
   B3) curing the arrangement produced under step B2) to produce the second layer having a filler mixed in the cured polysiloxane material, which comprises a three-dimensional crosslinking network based primarily on T-units,
   wherein the first and second layer are crosslinked to each other at their interface,
   wherein the produced conversion element is formed as a plate having a thickness of at least 100 μm.

7. The method according to claim 6,
wherein the first and second layers are chemically crosslinked to each other at their interface forming a single crosslinked network.

8. The method according to claim 6,
wherein the polysiloxane precursor material in the first and/or second layer comprises the formula:

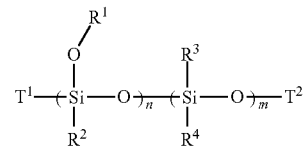

wherein T1 and T2 represent terminal groups, R1 to R4 each represent side groups, $0.8 \leq n \leq 1$, $0 \leq m < 0.2$ and $n+m=1$.

9. The method according to claim 6,
wherein the first layer is only partially cured in step A3), and the second layer is dispensed over the top of the partially cured first layer.

10. The method according to claim 6,
wherein the first and the second layer comprise the same cured polysiloxane material and the three-dimensional crosslinking network is continuous from one layer to the other.

11. The method according to claim 6,
wherein the polysiloxane precursor material is a methyl alkoxy polysiloxane having an alkoxy content ranging from 10 wt % to 50 wt %.

12. The method according to claim 6,
wherein the first layer has a thickness of 20 μm to 80 μm.

13. The method according to claim 6,
wherein the polysiloxane precursor material has a molecular weight of less than 5000 g/mol.

14. The method according to claim 6,
wherein the first and/or second layer(s) is/are applied by means of spray-coating, dip-coating, spin-coating, drop-casting, tape-casting or doctor blading.

15. The method according to claim 13 wherein the siloxane precursor has a molecular weight of less than 1500 g/mol.

* * * * *

UNITED STATES PATENT AND TRADEMARK OFFICE
CERTIFICATE OF CORRECTION

PATENT NO. : 11,515,454 B2
APPLICATION NO. : 16/909685
DATED : November 29, 2022
INVENTOR(S) : Alan Piquette It is certified that error appears in the above-identified patent and that said Letters Patent is hereby corrected as shown below:

In the Claims

Column 18, Claim 1, Line 33 reads as follows:
each represent side groups, $0.8 \leq n \leq 1$, $0 \leq m \leq 0.2$ and It should read as follows:
each represent side groups, $0.8 \leq n \leq 1$, $0 \leq m < 0.2$ and Signed and Sealed this
Twenty-fourth Day of January, 2023

Katherine Kelly Vidal
*Director of the United States Patent and Trademark Office*